(12) United States Patent
Cariker et al.

(10) Patent No.: US 10,278,296 B2
(45) Date of Patent: *Apr. 30, 2019

(54) SHROUD FOR AN ELECTRONIC DEVICE

(71) Applicant: Western Digital Technologies, Inc., Irvine, CA (US)

(72) Inventors: Bruce A. Cariker, Diamond Bar, CA (US); Kevin M. Takeuchi, Tustin, CA (US); Takashi Kono, Monterey Park, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/640,050

(22) Filed: Jun. 30, 2017

(65) Prior Publication Data

US 2017/0303412 A1 Oct. 19, 2017

Related U.S. Application Data

(63) Continuation of application No. 14/275,363, filed on May 12, 2014, now Pat. No. 9,699,923.

(60) Provisional application No. 61/946,398, filed on Feb. 28, 2014.

(51) Int. Cl.
*F21V 1/00* (2006.01)
*H05K 5/02* (2006.01)
*G11B 33/10* (2006.01)
*H05K 5/00* (2006.01)
*H05K 1/02* (2006.01)

(52) U.S. Cl.
CPC .......... *H05K 5/0217* (2013.01); *G11B 33/10* (2013.01); *H05K 1/0274* (2013.01); *H05K 5/0017* (2013.01)

(58) Field of Classification Search
CPC .... G11B 33/10; H05K 1/0274; H05K 5/0017; H05K 5/0217
See application file for complete search history.

(56) References Cited

U.S. PATENT DOCUMENTS

| 6,229,713 | B1 * | 5/2001 | Schmitt ................... G06F 1/182 |
| | | | 174/350 |
| 6,550,949 | B1 | 4/2003 | Bauer et al. |
| 7,086,754 | B2 | 8/2006 | Mooney |
| 7,701,705 | B1 | 4/2010 | Szeremeta |
| 8,064,194 | B2 | 11/2011 | Szeremeta |
| 8,113,873 | B1 | 2/2012 | Sarraf |
| 8,133,426 | B1 | 3/2012 | Yurchenco et al. |
| 8,358,395 | B1 | 1/2013 | Szeremeta |
| 8,417,979 | B2 | 4/2013 | Maroney |

(Continued)

*Primary Examiner* — Ali Alavi

(74) *Attorney, Agent, or Firm* — Knobbe, Martens, Olson & Bear LLP

(57) ABSTRACT

A shroud including a body comprising a first side, a second side opposite the first side, and a printed circuit board assembly ("PCBA") reception unit configured to receive a PCBA unit of an electronic device, wherein the PCBA unit comprises multiple light emitting diode ("LED") units which emit multiple light emitting diode ("LED") signals. The shroud can also include a plurality of ribs located on the body and configured to contact a cover for the electronic device, wherein the plurality of ribs are configured to substantially isolate each of the multiple LED signals, and wherein the body and the plurality of ribs comprise a resilient material.

22 Claims, 13 Drawing Sheets

(56) References Cited

U.S. PATENT DOCUMENTS

| | | | |
|---|---|---|---|
| 8,462,460 B1 | 6/2013 | Szeremeta et al. | |
| 8,498,088 B1 | 7/2013 | Klein | |
| 8,547,658 B1 | 10/2013 | Szeremeta | |
| 9,699,923 B1 * | 7/2017 | Cariker | H05K 5/0217 |

* cited by examiner

SHROUD FOR AN ELECTRONIC DEVICE

CROSS-REFERENCE TO RELATED APPLICATIONS

This application is a continuation of U.S. patent application Ser. No. 14/275,363, filed on May 12, 2014 and issued as U.S. Pat. No. 9,699,923, which claims the benefit of U.S. Provisional Application No. 61/946,398, filed on Feb. 28, 2014, entitled "SHROUD COMPRISING COMBINED LED SHIELD, PCBA MOUNT, AND SHOCK MOUNT," which are hereby incorporated by reference in their entirety.

BACKGROUND

In a conventional electronic device, an enclosure can comprise many components. Thus, in a compact enclosure, there may not be a lot of space available. Thus, light bulbs to indicate activity of the electronic device may be limited in location. In such a case, a light pipe may be used to transport the light from the light bulbs to the location where the light from the light bulbs should be viewed on the enclosure.

However, a light pipe may be unsuitable if there are awkward angles or many different twists and turns between the location of the light bulbs and the location where the light from the light bulbs should be viewed on the enclosure. The light pipe may not be able to traverse all of the awkward angles or the many different twists and turns and deliver the light with sufficient brightness. Alternatively, the light pipe may be prohibitively expensive.

BRIEF DESCRIPTION OF THE DRAWINGS

The features and advantages of the present embodiments will become more apparent from the detailed description set forth below when taken in conjunction with the drawings, wherein.

DETAILED DESCRIPTION

Figure 1:
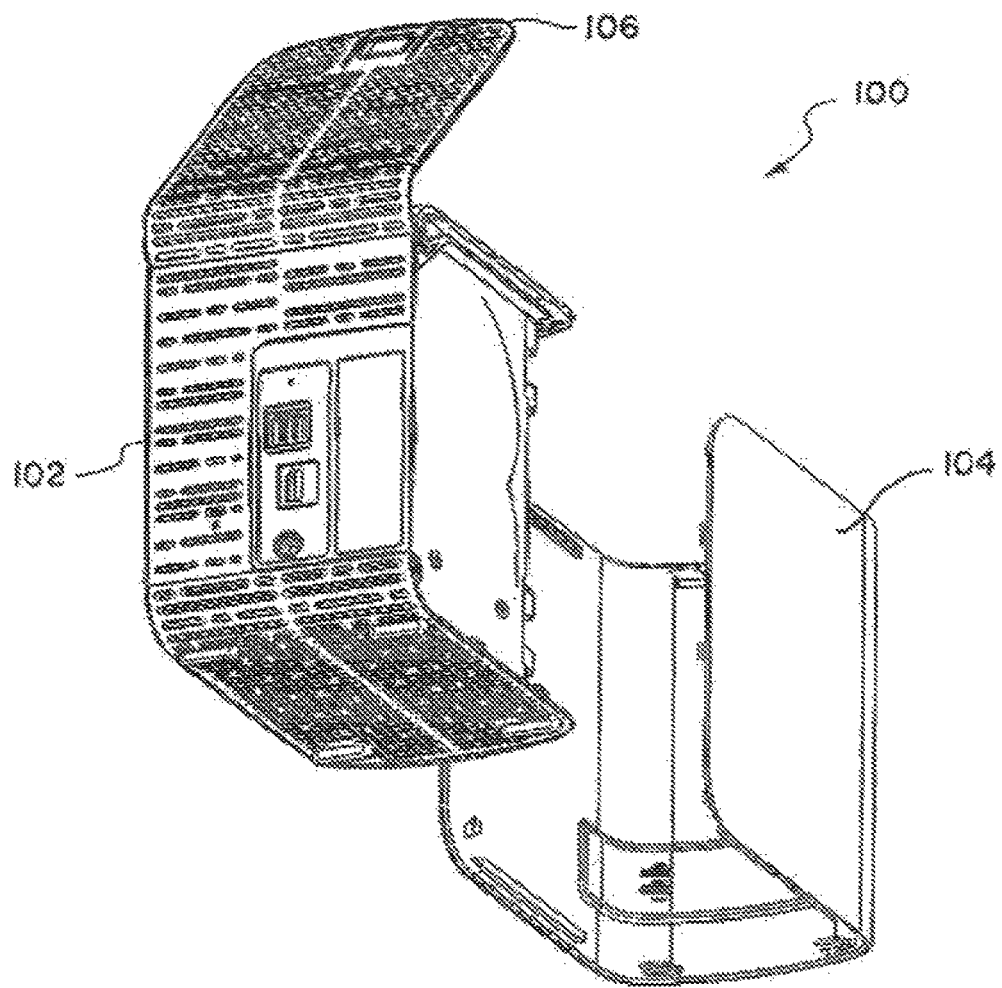
FIG. 1 depicts an electronic device according to an embodiment.

In an embodiment, an electronic device 100 is shown in FIG. 1. In an embodiment, the electronic device 100, such as a networked attached storage ("NAS") device or direct attached storage ("DAS") device, can comprise an enclosure 102. The enclosure 102 can comprise a cover 104 and a lid 106. In an embodiment, the lid 106 can pivot open to reveal some of the contents of the electronic device 100.

Figure 2:
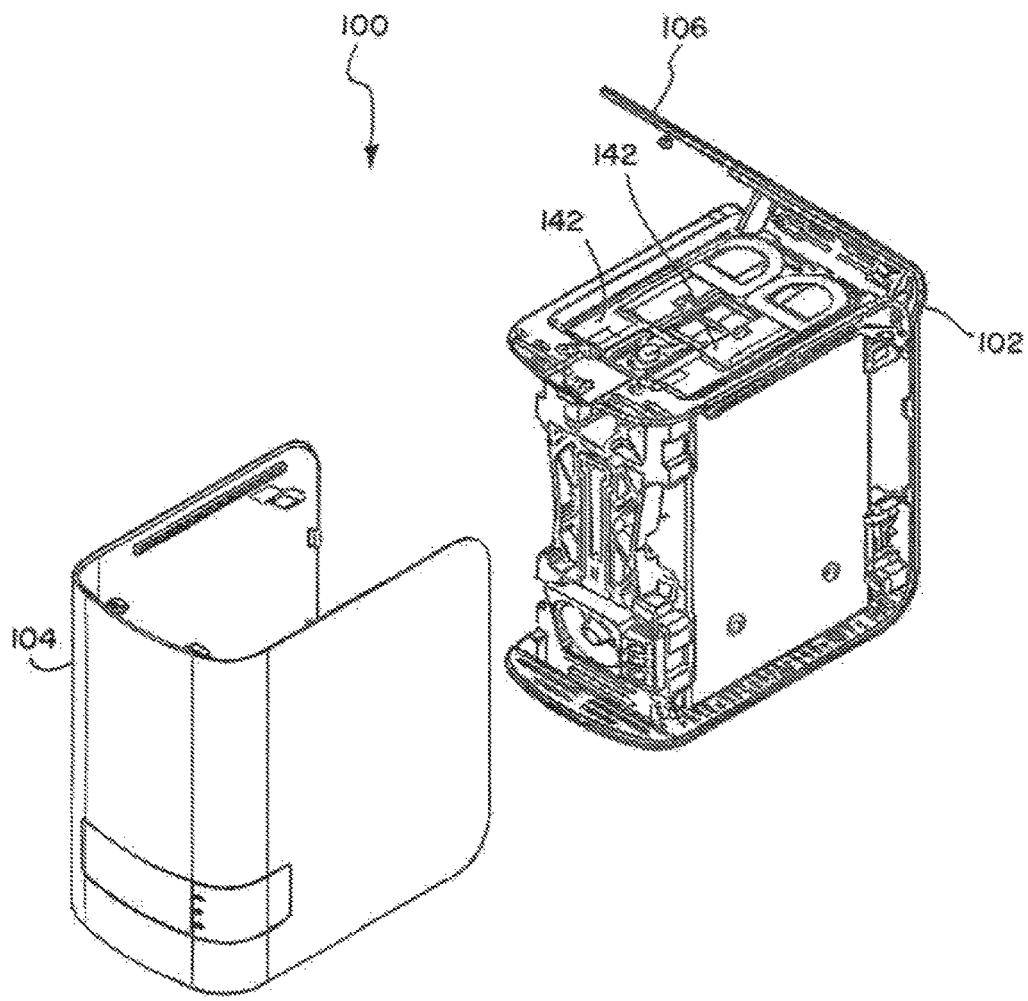
FIG. 2 depicts an electronic device according to an embodiment.

In an embodiment shown in FIG. 2, the electronic device 100 can comprise one or more data storage devices 142, such as hard disk drives, solid state drives, or hybrid drives. In an embodiment, the hard disk drives can comprise a magnetic rotating disk while the solid state drive can comprise solid state memory. In an embodiment, the hybrid drive can comprise both a magnetic rotating disk and a solid state memory.

While the description herein refers to solid state memory generally, it is understood that solid state memory may comprise one or more of various types of solid state non-volatile memory devices such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete NVM (non-volatile memory) chips, or any combination thereof.

Figure 3:
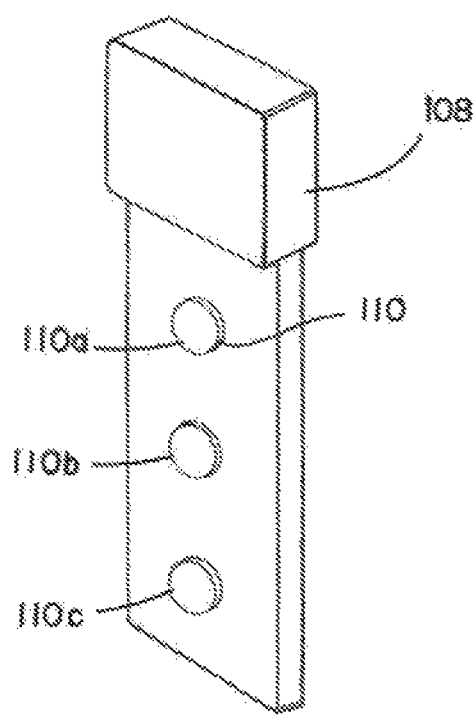
FIG. 3 depicts a printed circuit board assembly ("PCBA") unit according to an embodiment.

In an embodiment, LED lighting is used to provide various signals that indicate the operation of components within the enclosure 102. In an embodiment, the LED lighting is located close to an output area and placed on a separate printed circuit board assembly ("PCBA") unit 108 as shown in FIG. 3. In the embodiment shown in FIG. 3, the PCBA unit 108 comprises one or more LED units 110 which emit multiple LED signals such as LED units 110a, 110b, and 110c. In an embodiment, the PCBA unit 108 can be configured to activate one or more of the LED signals based on an activity or a status of the electronic device 100, the data storage devices 142, or any other components of the electronic device 100.

In an embodiment, a shroud 112 can receive the PCBA unit 108. The shroud 112 can be seen, for example, in an embodiment shown in FIG. 4. In the embodiment shown in FIG. 4, the shroud 112 comprises a body 138. The body 138 can include a first side 114 and a second side 116 opposite the first side 114. Furthermore, the body 138 can comprise a PCBA reception unit 118 which is configured to receive the PCBA unit 108. For example, the PCBA unit 108 can be slid into the PCBA reception unit 118.

The shroud 112 can also comprise a plurality of ribs 124, such as the ribs 124a, 124b, and 124c. The plurality of ribs 124 can be configured to contact the cover 104 for the electronic device 100. Furthermore, in an embodiment, the ribs are configured to substantially isolate each of the multiple LED signals from the LED units 110 in the PCBA unit 108. For example, if a first LED unit is a red LED and a second LED unit is a yellow LED, each of the two colors red and yellow may be seen by a user instead of two orange colors or other colors created by mixing red and yellow.

The LED signals can be transmitted through apertures 134 located on the ribs 124a, 124b, and 124c, which will be described in more detail below. In an embodiment, the plurality of ribs 124 also define a plurality of grooves 126a and 126b, which will be described in more detail below.

In an embodiment, by placing the PCBA unit 108 in the PCBA reception unit 118, the LEDs 110 can be closer to the cover 104. In an embodiment, this can increase the location where the LED signals from the LEDs 110 can be seen on the cover 104. That is, the LEDs 110 can be placed in locations within the enclosure 102 where there is additional space. Since the enclosure 102 generally contains many components for the electronic device 100, this increase in possible location placement can increase the number of LEDs 110 that can be utilized within the PCBA unit 108. In addition, manufacturing costs can also be reduced since an amount of light pipes utilized with awkward angles can be reduced.

In an embodiment, the shroud 112 can also include a plurality of elongated tabs 120 extending from the first side 114 of the body 138. The plurality of elongated tabs 120 include a plurality of anchors 122 to secure the body 138 to the electronic device 100, which will be described in more detail later.

Figure 5:
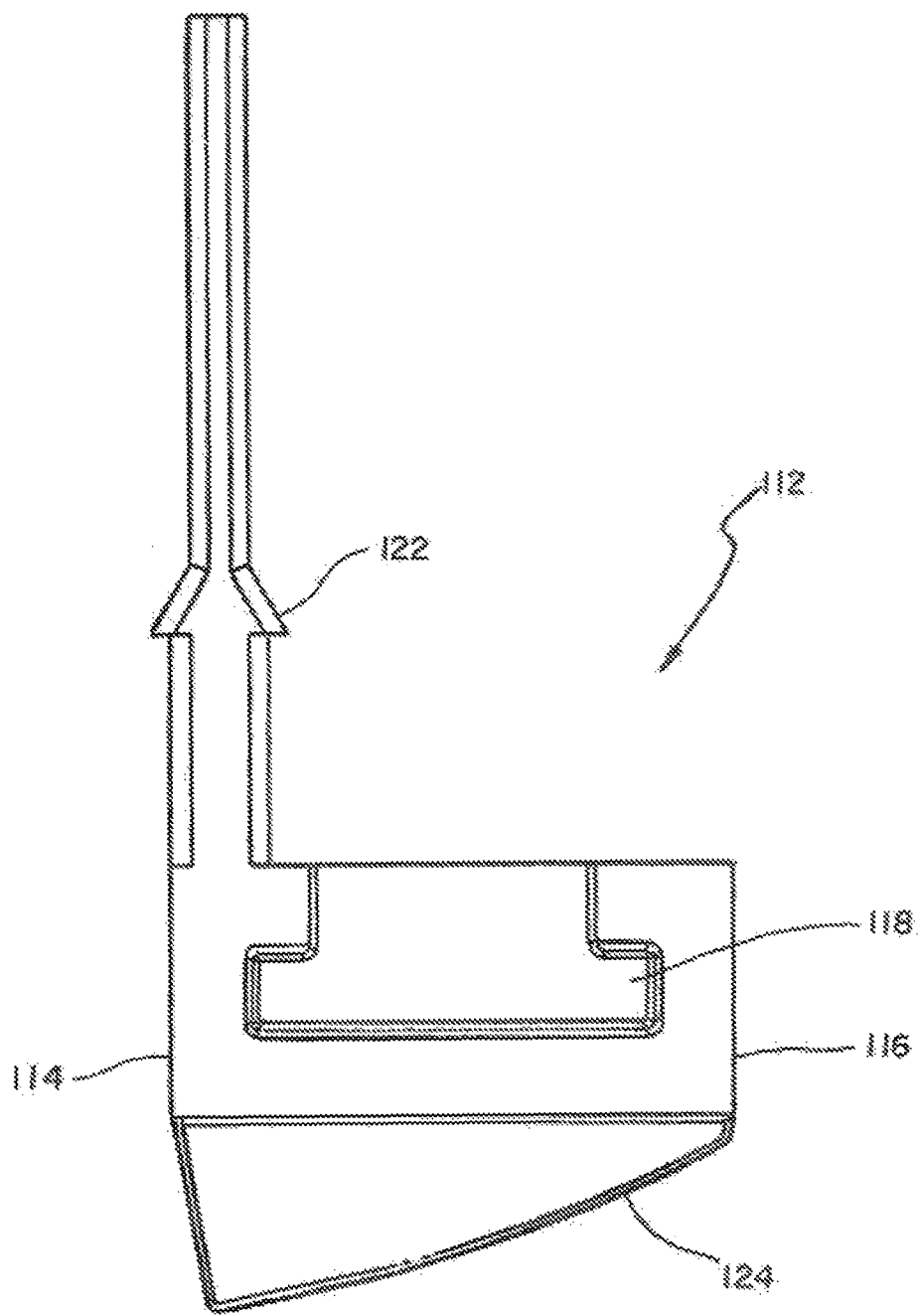
FIG. 5 depicts a top view of a shroud according to an embodiment.
Figure 6:
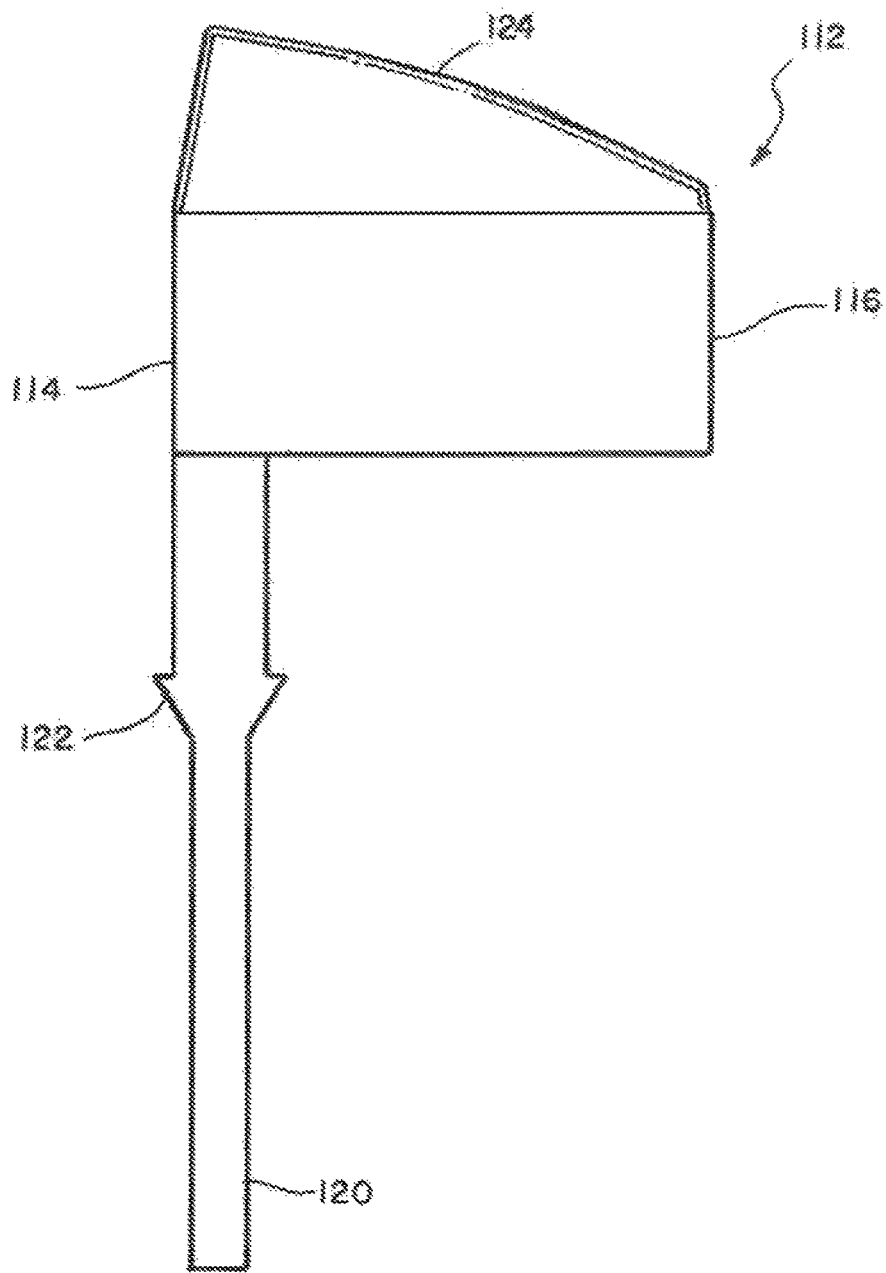
FIG. 6 depicts a bottom view of a shroud according to an embodiment.
Figure 7:
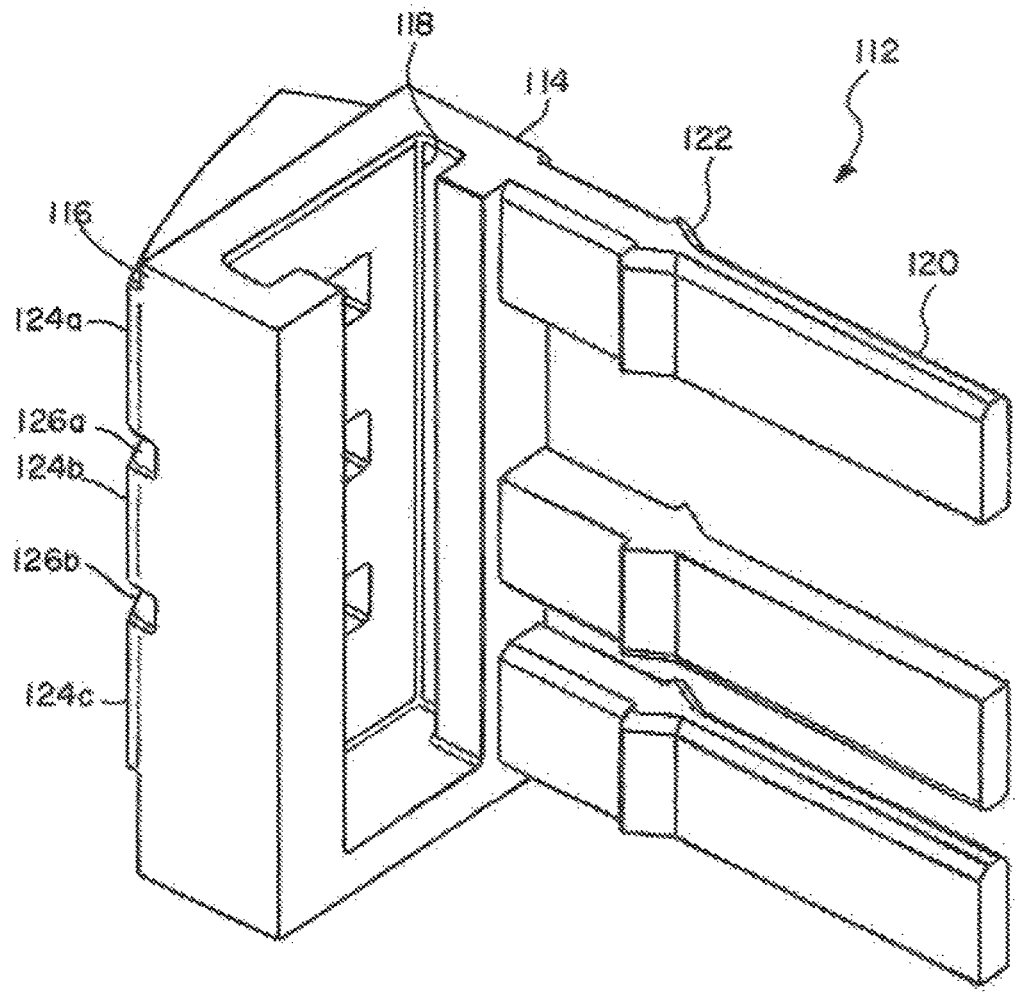
FIG. 7 depicts a perspective view of a shroud according to an embodiment.

Additional views of the shroud 112 are shown in the embodiments depicted in FIGS. 5-7. In the embodiment shown in FIG. 5, a top view of the shroud 112 can be seen. In the embodiment shown in FIG. 6, a bottom view of the shroud 112 can be seen. In the embodiment shown in FIG. 7, a rear perspective view of the shroud 112 can be seen.

Figure 8:
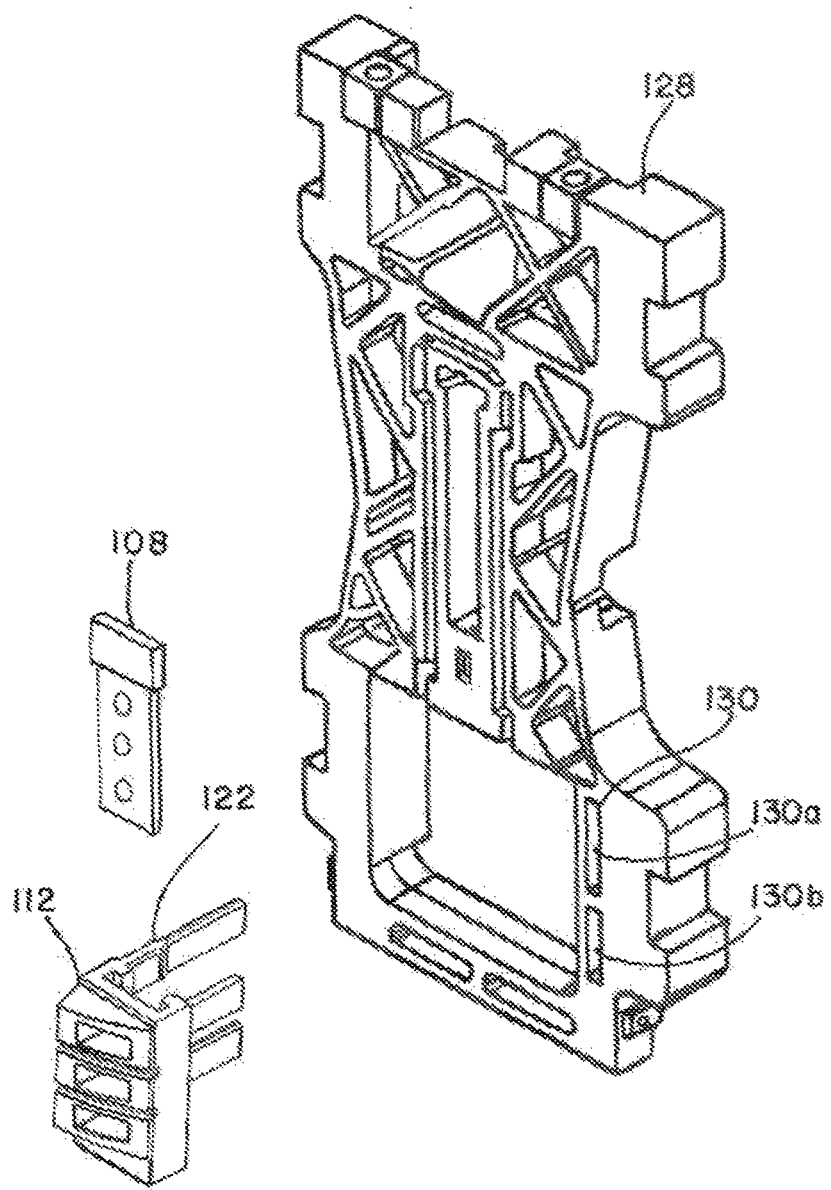
FIG. 8 depicts a shroud, a PCBA unit, and a structural strut according to an embodiment.
Figure 9:
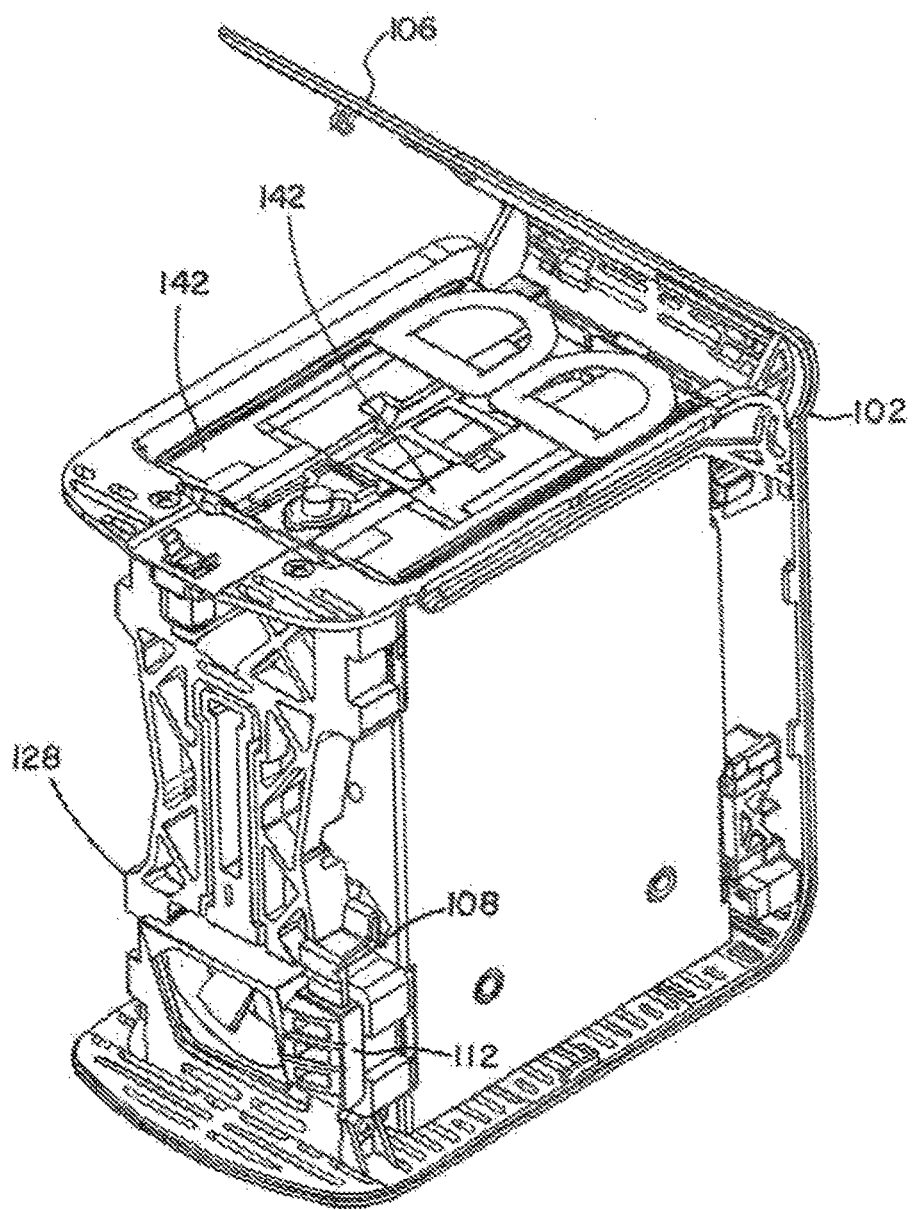
FIG. 9 depicts an electronic device according to an embodiment.
Figure 10:
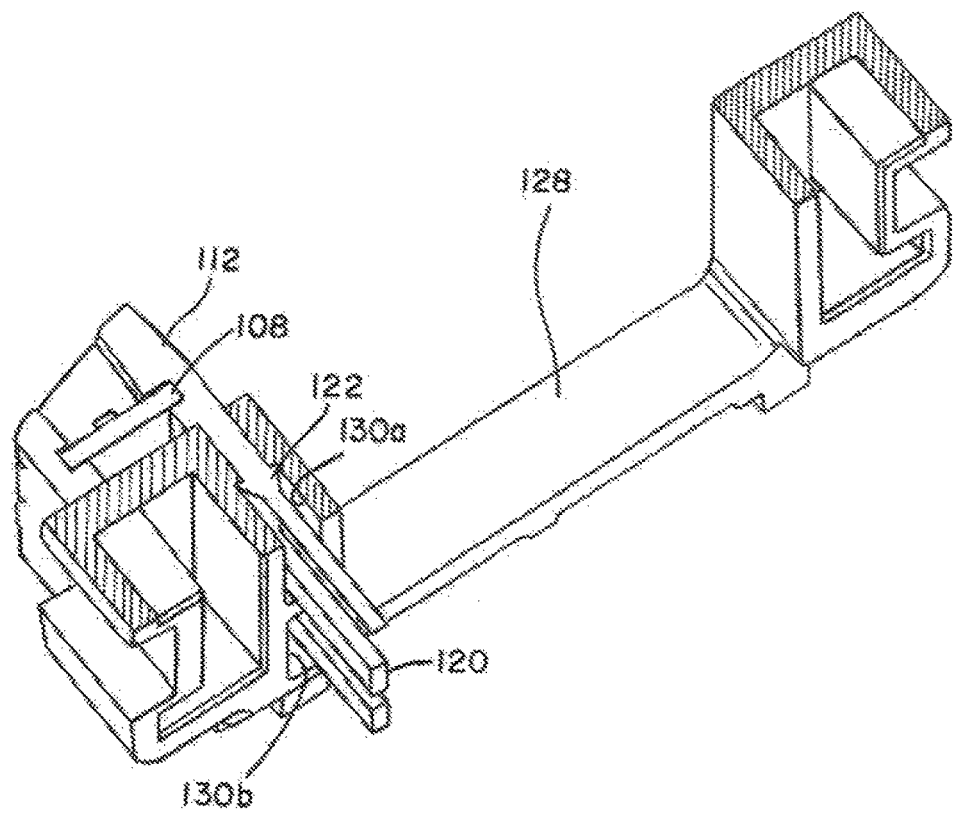
FIG. 10 depicts a partial view of a shroud and a PCBA unit mounted to a structural strut according to an embodiment.

As seen in the embodiments shown in FIGS. 8 and 9, the shroud 112 and the PCBA unit 108 can be mounted onto a structural strut 128 of the electronic device 100. The structural strut 128 can comprise slits 130 such as the slits 130a and 130b. The anchors 122 can be configured to enter and be pulled through the slits 130a and 130b, as seen in the embodiment shown in FIG. 10. In an embodiment, the anchors 122 are configured to resist re-entering the slits 130a and 130b after the anchors 122 have been pulled through the slits 130a and 130b. This can, for example, secure the body 138 (FIG. 4) of the shroud 112 to the structural strut 128. In an embodiment, the ends of the elongated tabs 120 may be cut or removed to reduce a length of the elongated tabs 120. By reducing the length of the elongated tabs 120, an amount of clutter within the electronic device 100 can be reduced.

Figure 4:
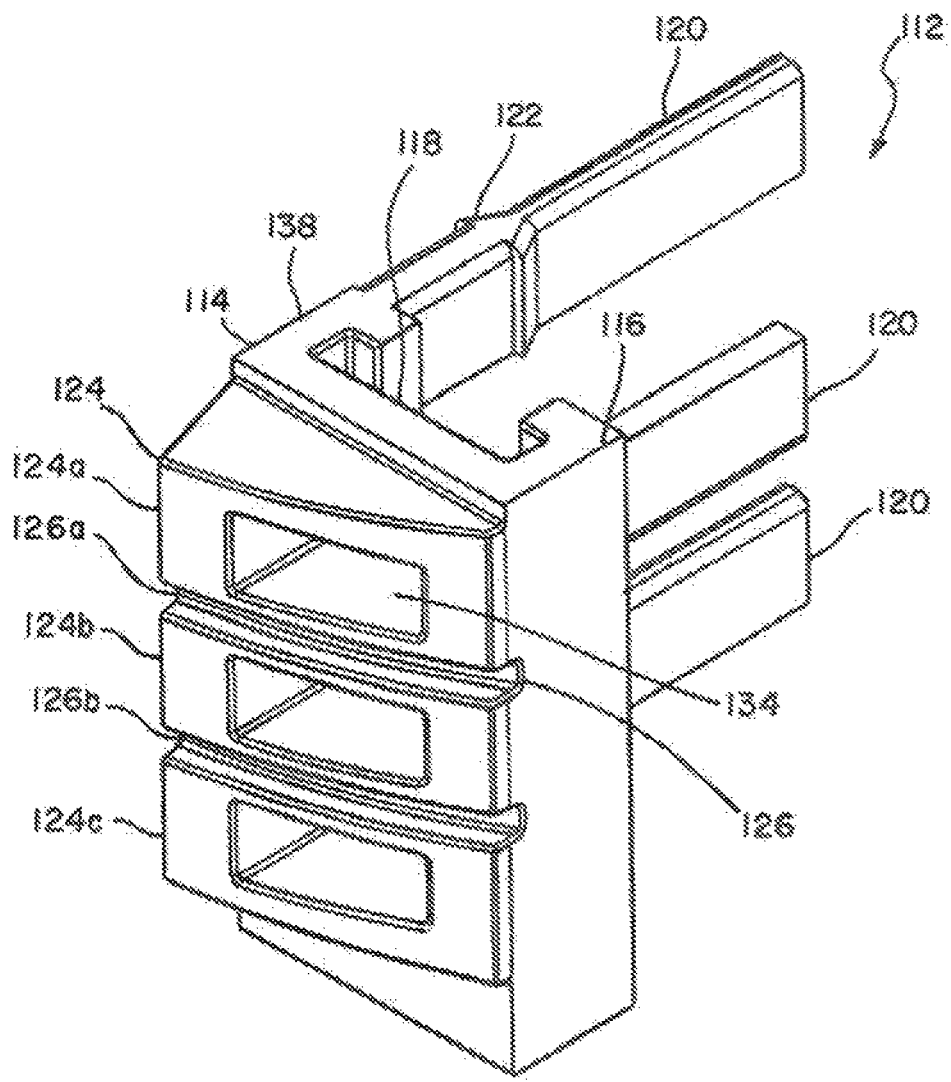
FIG. 4 depicts a perspective view of a shroud according to an embodiment.
Figure 11:
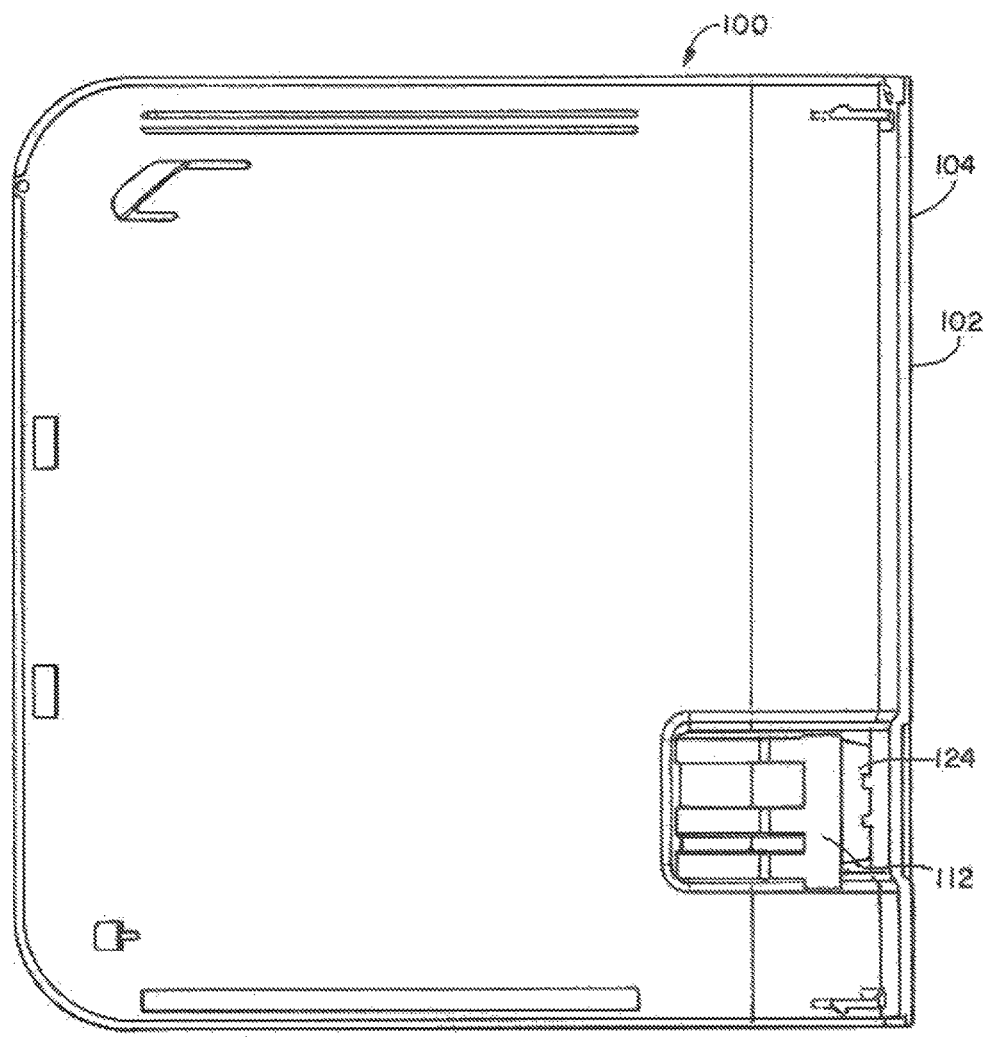
FIG. 11 depicts a partial view of an electronic device according to an embodiment.
Figure 12:
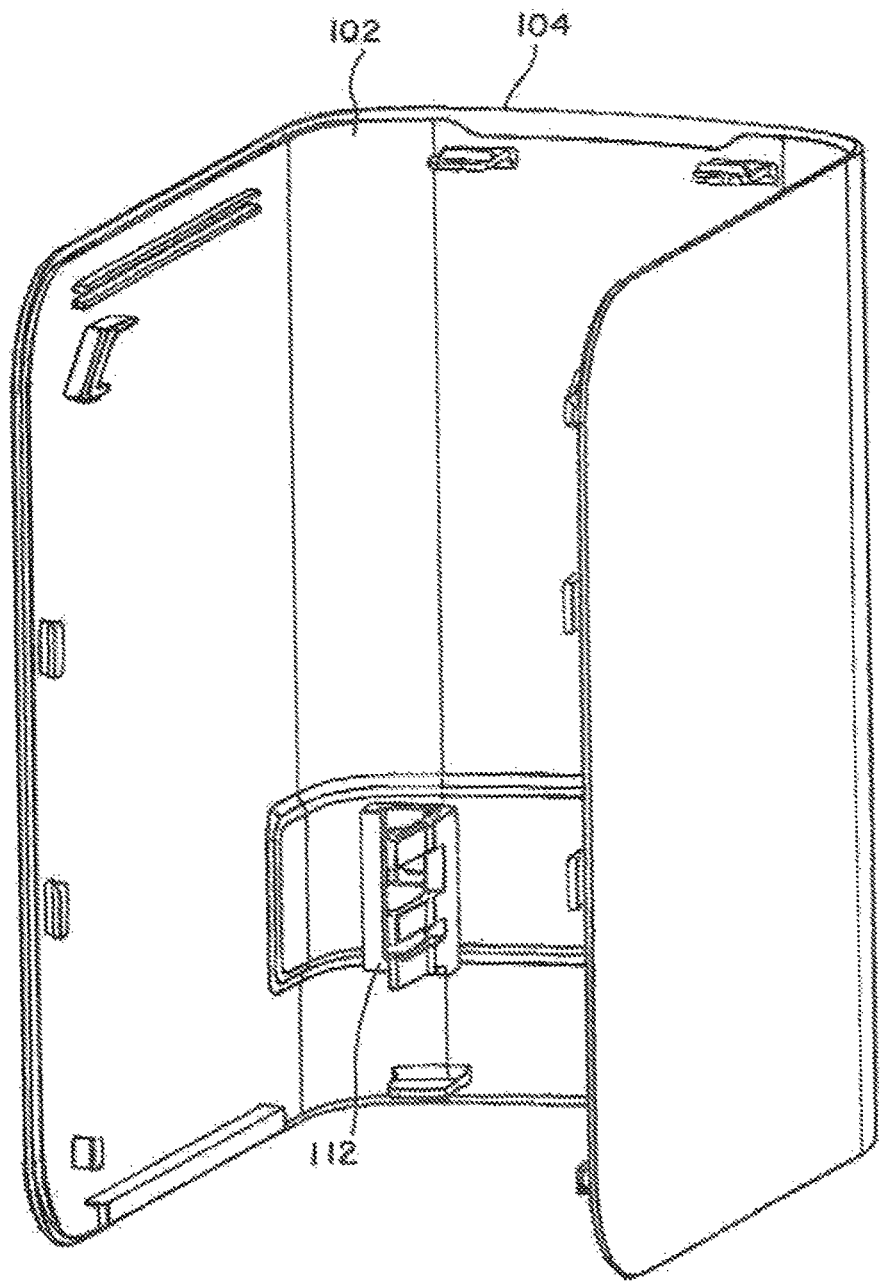
FIG. 12 depicts a partial view of a shroud and a cover according to an embodiment.

In an embodiment, as seen in FIGS. 11 and 12, the shroud 112 can be configured to contact the enclosure 102. For example, the shroud 112 can be configured to contact the cover 104 of the enclosure 102. Furthermore, as seen in FIGS. 4, 11, and 12, the plurality of ribs 124 are configured to reduce deflection of the cover 104 when the cover 104 is impacted. In an embodiment, this can reduce the likelihood that the cover 104 will separate from the enclosure 102.

The plurality of ribs 124 can also be configured to reduce an amount of force that is transmitted to the PCBA unit 108 when the cover 104 is impacted. In an embodiment, this can reduce the likelihood of damage to the PCBA unit 108 or causing the PCBA unit 108 to be moved such that the LED units 110 are blocked by the plurality of ribs 124 or portions of the cover 104.

In an embodiment, the plurality of ribs 124 are angled in a manner which substantially matches a curvature of the cover 104. In an embodiment, this can improve force distribution to the plurality of ribs 124, which can allow the plurality of ribs 124 to more readily absorb or redistribute the force from an impact to the cover 104.

Figure 13:
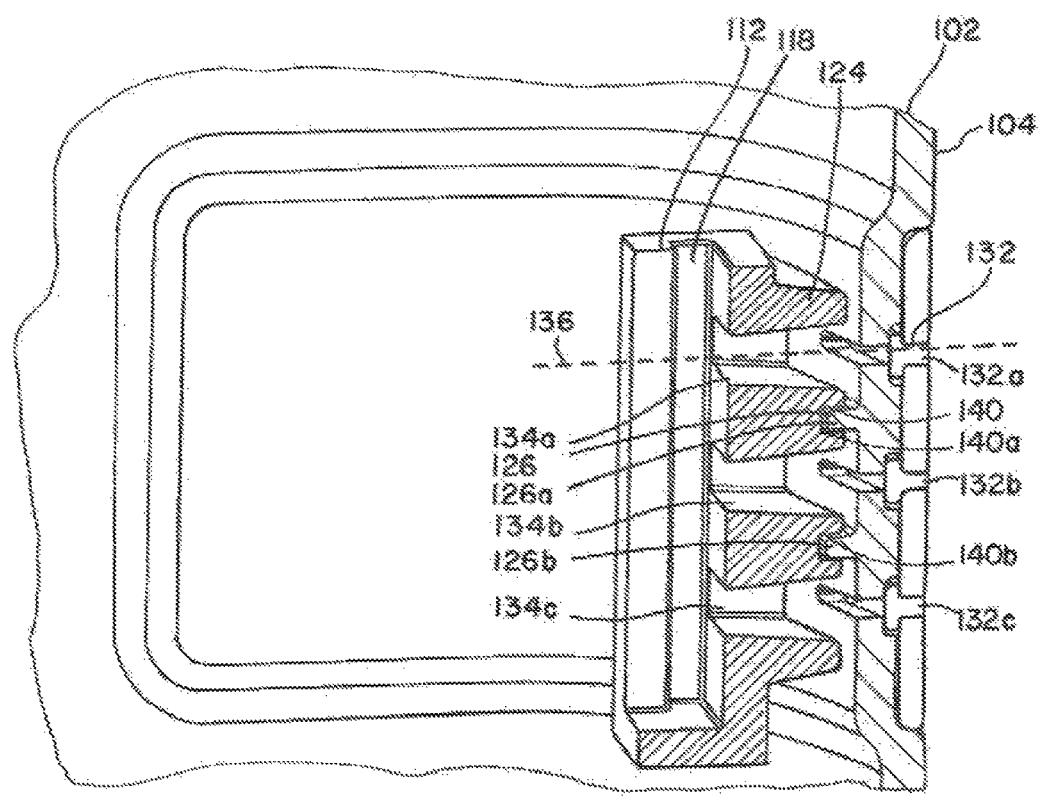
FIG. 13 depicts a partial view of a shroud and a cover according to an embodiment.

In an embodiment, as seen in FIG. 13, the cover 104 comprises lenses 132 such as lens 132a, 132b6, and 132c. In an embodiment, when the PCBA unit 108 is placed in the PCBA reception unit 118, the LED units 110a, 110b, and 110c are aligned with the apertures 134a, 134b, and 134c respectively. Furthermore, the LED units 110a, 110b, and 110c are also aligned with the lenses 132a, 132b, and 132c. Thus, the LED signals can transmit through the apertures 134 and the lenses 132 so that they are visible to a user. For example, the LED unit 110a is aligned with the aperture 134a and the lens 132a as indicated by the line 136. Thus, the LED signal from the LED unit 110a can be transmitted through the apertures 134a and the lens 132a.

Furthermore, as seen in an embodiment in FIG. 13, the cover 104 comprises a plurality of positioning ribs 140 such as positioning ribs 140a and 140b. As previously noted, the shroud 112 comprises a plurality of grooves 126 such as grooves 126a and 126b. In an embodiment, the plurality of grooves 126 are configured to mate with the plurality of positioning ribs 140 to reduce movement of the shroud 112 relative to the lenses 132 on the cover 104, and movement of the LED units 110 relative to the lenses 132 on the cover 104. This can aid, for example, in maintaining the alignment of the LED units 110 relative to the apertures 134 and the lenses 132 to prevent the LED signals from the LED units 110 from being blocked by the positioning ribs 124 or other components of the shroud 112, or the cover 104.

In addition, the plurality of ribs 124 are configured to reduce deflection of the lenses 132 when the cover 104 is impacted. In an embodiment, this can reduce the likelihood of the lenses 132 being separated from the cover 104.

In an embodiment, the shroud 112 and the components of the shroud 112 such as the plurality of ribs 124, the body 138, and the elongated tabs 120 comprise a resilient material. In an embodiment, the resilient material comprises a rubber material. The rubber material can comprise, for example, an ethylene propylene diene monomer ("EPDM") rubber material. Furthermore, the EPDM rubber material can comprise a durometer between approximately 40 shore A and 65 shore A.

In an embodiment, the use of a resilient material comprising a durometer between approximately 40 shore A and 65 shore A can prevent or reduce the likelihood of the resilient material being too sticky and being difficult or relatively expensive to manufacture. Furthermore, in an embodiment, this can increase the shock absorption properties of the shroud 112. In an embodiment, this can also increase the ability of the shroud to reduce deflection of the cover 104 or the lenses 132. Although a rubber material and an EPDM rubber material are disclosed, additional materials may be utilized which have similar shock absorption and deflection reduction properties while maintaining a relatively low manufacturing cost.

Those of ordinary skill would appreciate that the various illustrative logical blocks, modules, and algorithm parts described in connection with the examples disclosed herein may be implemented as electronic hardware, computer software, or combinations of both. Furthermore, the embodiments can also be embodied on a non-transitory machine readable medium causing a processor or computer to perform or execute certain functions.

To clearly illustrate this interchangeability of hardware and software, various illustrative components, blocks, modules, circuits, and process parts have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosed apparatus and methods.

The parts of a method or algorithm described in connection with the examples disclosed herein may be embodied directly in hardware, in a software module executed by a processor, or in a combination of the two. The parts of the method or algorithm may also be performed in an alternate order from those provided in the examples. A software module may reside in RAM memory, flash memory, ROM memory, EPROM memory, EEPROM memory, registers, hard disk, a removable disk, an optical disk, or any other form of storage medium known in the art. An exemplary storage medium is coupled to the processor such that the processor can read information from, and write information to, the storage medium. In the alternative, the storage medium may be integral to the processor. The processor and the storage medium may reside in an Application Specific Integrated Circuit (ASIC).

The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described embodiments are to be considered in all respects only as illustrative and not restrictive and the scope of the disclosure is, therefore, indicated by the appended claims rather than by the foregoing description. All changes which come within the meaning and range of equivalency of the claims are to be embraced within their scope.

What is claimed is:

1. An electronic device comprising:
   an enclosure comprising a cover;
   a printed circuit board assembly ("PCBA") configured to emit multiple light emitting diode ("LED") signals;
   a connector located within the enclosure; and
   a shroud comprising:
      a housing including a PCBA receptor configured to receive the PCBA of the electronic device;
      a plurality of compartments positioned in the housing and configured to contact the cover and to substantially isolate each of the multiple LED signals; and
      at least one connector configured to secure the housing to the connector of the electronic device,
      wherein the shroud comprises a resilient material.

2. The electronic device of claim 1, wherein the at least one connector of the shroud comprises an anchor.

3. The electronic device of claim 1, wherein:
   the at least one connector of the shroud comprises a plurality of connectors each including an anchor; and
   each of the anchors is configured to pass through a corresponding slit of a plurality of slits formed on the connector of the electronic device.

4. The electronic device of claim 3, wherein each of the anchors is shaped to prevent dislodgement from the corresponding slit after the anchor has passed through the corresponding slit.

5. The electronic device of claim 1, wherein:
   the plurality of compartments of the shroud define a plurality of grooves located between the plurality of compartments; and
   the plurality of grooves are configured to mate with a plurality of protrusions formed on the cover of the electronic device to reduce movement of the shroud relative to a lens on the cover and to reduce movement of the PCBA relative to the lens.

6. The electronic device of claim 1, wherein the plurality of compartments of the shroud are shaped to substantially match a curvature of a portion of the cover of the electronic device configured to contact the plurality of compartments.

7. The electronic device of claim 1, wherein the plurality of compartments of the shroud are shaped and positioned to at least partially reduce deflection of the cover of the electronic device when the cover is impacted.

8. The electronic device of claim 7, wherein the plurality of compartments of the shroud are shaped and positioned to at least partially reduce deflection of a lens on the cover of the electronic device when the cover is impacted.

9. The electronic device of claim 1, wherein the plurality of compartments of the shroud are shaped and positioned to at least partially reduce an amount of force transmitted to the PCBA receptor of the shroud when the cover of the electronic device is impacted.

10. The electronic device of claim 1, wherein the resilient material comprises a rubber material.

11. The electronic device of claim 10, wherein the rubber material comprises an ethylene propylene diene monomer ("EPDM") rubber material comprising a durometer between approximately 40 shore A and 65 shore A.

12. A shroud comprising:
    a housing comprising a printed circuit board assembly ("PCBA") receptor configured to receive a PCBA of an electronic device, wherein the PCBA is configured to emit multiple light emitting diode ("LED") signals;
    a plurality of compartments positioned in the housing and configured to substantially isolate each of the multiple LED signals; and
    at least one connector configured to secure the housing to the electronic device,
    wherein the housing and the plurality of compartments comprise a resilient material.

13. The shroud of claim 12, wherein the at least one connector comprises an anchor.

14. The shroud of claim 12, wherein:
    the at least one connector comprises a plurality of connectors each including an anchor; and
    each of the anchors is configured to pass through a corresponding slit of a plurality of slits formed on the electronic device.

15. The shroud of claim 14, wherein each of the anchors is shaped to prevent dislodgement from the corresponding slit after the anchor has passed through the corresponding slit.

16. The shroud of claim 12, wherein:
    the plurality of compartments define a plurality of grooves located between the plurality of compartments; and
    the plurality of grooves are configured to mate with a plurality of protrusions formed on a cover of the electronic device to reduce movement of the housing relative to a lens on the cover and to reduce movement of the PCBA relative to the lens.

17. The shroud of claim 12, wherein the plurality of compartments are shaped to substantially match a curvature of a portion of a cover of the electronic device.

18. The shroud of claim 12, wherein the plurality of compartments are shaped and positioned to at least partially reduce deflection of at least one of a cover of the electronic device or a lens on the cover when the cover is impacted.

19. The shroud of claim 12, wherein the plurality of compartments are shaped and positioned to at least partially reduce an amount of force transmitted to the PCBA receptor when a cover of the electronic device is impacted.

20. The shroud of claim 12, wherein the resilient material comprises a rubber material.

21. The shroud of claim 20, wherein the rubber material comprises an ethylene propylene diene monomer ("EPDM") rubber material comprising a durometer between approximately 40 shore A and 65 shore A.

22. A shroud comprising:
a housing comprising a receiving means for receiving a printed circuit board assembly ("PCBA") of an electronic device, wherein the PCBA is configured to emit multiple light emitting diode ("LED") signals;
an isolating means for substantially isolating each of the multiple LED signals, the isolating means positioned in the housing; and
a connecting means for securing the housing to the electronic device,
wherein the housing and the isolating means comprise a resilient material.

\* \* \* \* \*